United States Patent
Sacco et al.

(10) Patent No.: US 10,890,615 B2
(45) Date of Patent: Jan. 12, 2021

(54) SENSOR WITH SELF DIAGNOSTIC FUNCTION

(71) Applicant: Melexis Technologies NV, Tessenderlo (BE)

(72) Inventors: Vincenzo Sacco, Grandson (CH); Mathieu Poezart, Saint-Aubin-Sauges (CH)

(73) Assignee: Melexis Technologies NV, Tessenderlo (BE)

( * ) Notice: Subject to any disclaimer, the term of this patent is extended or adjusted under 35 U.S.C. 154(b) by 375 days.

(21) Appl. No.: 15/873,325

(22) Filed: Jan. 17, 2018

(65) Prior Publication Data
US 2018/0203059 A1    Jul. 19, 2018

(30) Foreign Application Priority Data

Jan. 19, 2017 (EP) .................................... 17152105

(51) Int. Cl.
*G01R 31/26* (2020.01)
*G01R 31/28* (2006.01)
*G01R 31/3187* (2006.01)
*G01D 3/08* (2006.01)
*G06F 11/16* (2006.01)
(Continued)

(52) U.S. Cl.
CPC .......... *G01R 31/2644* (2013.01); *G01D 3/08* (2013.01); *G01D 5/24466* (2013.01); *G01R 31/2829* (2013.01); *G01R 31/2856* (2013.01); *G01R 31/2884* (2013.01); *G01R 31/3187* (2013.01); *G06F 11/1633* (2013.01); *G05B 9/03* (2013.01)

(58) Field of Classification Search
CPC ........ G01R 31/26; G01R 31/28; G01R 31/31; G01R 31/3187; G01D 3/08; G06F 11/16
See application file for complete search history.

(56) References Cited

U.S. PATENT DOCUMENTS

| | | | | |
|---|---|---|---|---|
| 4,734,687 A | * | 3/1988 | Jones | G05B 9/03 345/618 |
| 6,058,354 A | * | 5/2000 | Adame | G01R 21/133 324/117 H |

(Continued)

FOREIGN PATENT DOCUMENTS

| | | |
|---|---|---|
| DE | 102014103556 A1 | 9/2014 |
| DE | 102014109956 A1 | 1/2015 |

OTHER PUBLICATIONS

Extended European Search Report from EP Application No. EP 17152105, dated Jun. 13, 2017.

*Primary Examiner* — Neel D Shah
(74) *Attorney, Agent, or Firm* — Workman Nydegger

(57) ABSTRACT

A sensor system for providing a main signal and an error signal, comprising: a sensor unit providing a sensor signal; a first signal processor downstream of the sensor unit, adapted for receiving a second signal equal to or derived from a sensor signal, and for performing a first operations on the second signal so as to provide a first processed signal; a second signal processor for receiving the first processed signal and for performing second operations inverse of the first operations, so as to provide a second processed signal; and an evaluation unit for receiving the second signal and the second processed signal, and for evaluating whether the second signal matches the second processed signal within a predefined tolerance margin, and for providing the error signal.

20 Claims, 9 Drawing Sheets

(51) Int. Cl.
*G01D 5/244* (2006.01)
*G05B 9/03* (2006.01)

(56) References Cited

U.S. PATENT DOCUMENTS

| | | | |
|---|---|---|---|
| 2002/0050933 A1 | 5/2002 | Donat et al. | |
| 2008/0160660 A1* | 7/2008 | Shim | H01L 27/14609 438/59 |
| 2010/0262966 A1* | 10/2010 | Dow | G06F 1/3203 718/102 |
| 2010/0332179 A1* | 12/2010 | Kurtz | G01D 1/00 702/138 |
| 2012/0074972 A1* | 3/2012 | Rasbornig | B60T 8/885 324/750.3 |
| 2015/0125017 A1* | 5/2015 | Uhm | H04R 25/305 381/323 |

* cited by examiner

910

SENSOR WITH SELF DIAGNOSTIC FUNCTION

FIELD OF THE INVENTION

The present invention relates in general to the field of sensors, and more in particular to semiconductor sensors having self-diagnostics or self-test capabilities.

BACKGROUND OF THE INVENTION

Electronic components are being heavily used in automotive applications, not only for entertainment purposes (such as e.g. music), or assistance functions (such as e.g. electric mirror, or parking assistance), electronic sensors are also being used for steering assistance, engine control, and other safety-related functions. Evidently, the requirements in terms of reliability and system availability for such functions continues to increase, and safety standards (such as e.g. the SIL standard) are being developed, while at the same time pressure on costs remains high.

In order to meet safety standards, such as for example ASIL standards ("Automotive safety integrity level") or other safety standards in the automotive field, it is desired to implement and use corresponding self-tests, including built-in self-tests, not only at start-up but also during normal operation, as well as automatic monitoring structures or corresponding redundant functional blocks and/or signal paths.

Conventional sensor systems, in particular magnetic sensor systems, use a single-channel analog main signal path. Other conventional solutions use two identical sensors and processing paths to meet ASIL requirements. Obviously, a considerable drawback of such solutions is the corresponding doubling of the cost for providing not only one but two sensors and processing circuitry.

US2012074972 discloses a monolithic integrated circuit sensor system comprising a first sensor device having a first signal path for a first sensor signal on a semiconductor chip; and a second sensor device having a second signal path for a second sensor signal on the semiconductor chip, the second signal path being distinct from the first signal path, wherein a comparison of the signal from the first signal path and the signal from the second signal path provides a sensor system self-test.

There is always room for improvements or alternatives.

SUMMARY OF THE INVENTION

It is an object of the present invention to provide a sensor system or a sensor device with self-diagnostic function.

It is an object of particular embodiments of the present invention to provide such a system or device that is capable of detecting a fault condition during normal operation of the device.

It is an object of particular embodiments of the present invention to provide such a system or device that is also capable of reporting the detected fault condition on a network.

These and other objectives are accomplished by a method and circuit according to embodiments of the present invention.

According to a first aspect, the present invention provides a sensor system for providing a main signal indicative of a physical signal to be sensed, and an error signal indicative of a malfunction of a portion of the sensor system, the sensor system comprising: a sensor unit configured for providing a sensor signal; a first signal processor arranged downstream of the sensor unit, and adapted for receiving a second signal equal to or derived from a sensor signal, and being adapted for performing a first operation or a first set of operations on said second signal so as to provide a first processed signal; a second signal processor adapted for receiving the first processed signal and for performing a second operation or a second set of operations on the first processed sensor signal so as to provide a second processed signal, wherein the second operation or second set of operations are an inverse of the first operation or of the first set of operations; and an evaluation unit adapted for receiving the second signal or a delayed version of the second signal, and for receiving the second processed signal, and adapted for evaluating whether the second signal or its delayed version matches the second processed signal within a predefined tolerance margin, and adapted for providing an error signal corresponding to the result of the evaluation.

The second signal processor has at least one characteristic selected from the group consisting of: being slower, being less precise, having or generating more noise, occupying less space, dissipating less power than the first signal processing unit.

The predefined first function may consist of a single operation (for example: amplification), or may comprise a series of operations (for example: offset-correction, amplification, and ADC).

In an embodiment, the First Signal Processor comprises or consists of an analog-to-digital convertor, and the Second Signal Processor comprises or consists of a digital-to-analog convertor.

In an embodiment, the First Signal Processor comprises or consists of a time integrator, and the Second Signal Processor comprises or consists of a time derivator, or vice versa.

In an embodiment, the First Signal Processor comprises or consists of a multiplier, and the Second Signal Processor comprises or consists of a divider, or vice versa.

In an embodiment, the First Signal Processor comprises or consists of a modulator, and the Second Signal Processor comprises or consists of a demodulator, or vice versa.

In an embodiment, the First Signal Processor comprises or consists of an amplifier, and the Second Signal Processor comprises or consists of an attenuator, or vice versa.

In an embodiment, the First Signal Processor comprises or consists of a first frequency filter, and the Second Signal Processor comprises or consists of a second frequency filter, being the inverse of the first frequency filter.

In an embodiment, the First Signal Processor is adapted for performing a first mathematical function (f) selected from the group consisting of: a square function, a goniometric function, an exponential function, and the Second Signal Processor is adapted for performing a second mathematical function (g) selected from the group consisting of: a square root function, a goniometric function, a logarithmic function respectively, or vice versa.

Any of these functions and/or inverse functions may be implemented in the analog domain or in the digital domain. When implemented in the digital domain, they may be fully implemented in hardware, or partly in hardware and partly in software, or completely in software.

In an embodiment, the second signal processor has a signal-to-noise ratio of at least 3 dB or at least 6 dB or at least 9 dB or at least 12 dB lower than the first signal processor.

In an embodiment, the second signal processor occupies less than 50% or less than 25% of the space occupied by the first signal processor.

In an embodiment, the second signal processor consumes less than 50% or less than 25% energy or power than the first signal processor.

In an embodiment, the second signal processor is at least 2.0 or at least 4.0 times slower than the first signal processor.

In an embodiment, the sensor unit and the first signal processor and the second signal processor and the evaluation unit are implemented on a single substrate.

In an embodiment, the substrate is a CMOS substrate.

In an embodiment, an input of the first signal processor is directly connected to an output of the sensor unit, and the second signal is equal to the sensor signal.

In an embodiment, the first signal processor mainly comprises or is an analog signal processor, and the second signal processor mainly comprises or is an analog signal processor.

In an embodiment, the first signal processor mainly comprises or is an analog signal processor, and the second signal processor mainly comprises or is a digital signal processor.

In an embodiment, the first signal processor mainly comprises or is a digital signal processor, and the second signal processor mainly comprises or is an analog signal processor.

In an embodiment, the first signal processor mainly comprises or is a digital signal processor, and the second signal processor mainly comprises or is a digital signal processor.

What is meant by "analog signal processor" is written in the "definitions section".

It is an advantage of using an analog circuit for the forward or backward path in combination with a digital circuit in the other path, because this may provide a higher chance of fault detection.

When using a digital circuit in both the forward and backward path, it is advantageous to use a different algorithm, or using different software techniques, such as polling instead of using a hardware interrupt or a timer interrupt, or using a first operating system or scheduler in the first digital circuit, and using another operating system or scheduler in the second digital circuit. In some embodiments another processor core may be used in the forward and backward path, for example a 16 bit core in the forward path, and an 8-bit core in the backward path.

In an embodiment, the first signal processor is an analog circuit, and the second signal processor is also an analog circuit, each of these circuits comprising only components or functional blocks selected from the group consisting of: an adder, a subtractor, an analog amplifier, an ADC, a DAC, an analog filter, a delay, a sample-and-hold circuit.

In an embodiment, the first signal processor comprises an analog-to-digital convertor and the second signal processor comprises a digital-to-analog convertor.

In an embodiment, the first signal processor contains an analog circuit followed by an analog-to-digital convertor, and the second signal processor contains a digital circuit followed by a digital-to-analog-convertor.

This is a particularly interesting combination, because digital processing is less sensitive to noise, and can be easily designed to operate at a lower resolution or speed or accuracy or the like.

In a particular embodiment, the digital circuit comprises a look-up table, and the first processed signal PS1 is used as an index. The digital circuit may use less than all bits of the first processed signal PS1 as an index. Alternatively, the digital circuit may apply linear interpolation between two values obtained from the look-up table.

In an embodiment, the digital-to-analog-convertor has a lower resolution and/or a lower speed than the analog-to-digital convertor.

The space occupied by the DAC may be lower than the space occupied by the ADC, or the DAC may be more subjective to noise, or have a higher quantization noise, or the resolution of the DAC may be lower than that of the ADC, for example one bit less or two bits less, or more than two bits less.

In an embodiment, the evaluation unit comprises a first sample-and-hold circuit configured for sampling and holding the second signal as a first sample, and a second sample-and-hold circuit configured for sampling and holding the second processed signal as a second sample, and the evaluation unit further comprises comparator circuitry adapted for comparing whether the first sample deviates more than a predefined allowed deviation from the second sample; and the evaluation unit is configured for providing the error signal for indicating a fault condition if the first sample is found to deviate more than the predefined allowed deviation from the second sample.

In an embodiment, the evaluation unit is further adapted for delaying the first sample by a predefined delay to obtain a delayed first sample, the predefined delay corresponding to a sum of a first processing time of the first Signal Processor and a second processing time of the second Signal processor and optionally a third processing time of the analog-to-digital convertor and optionally a fourth processing time of the digital-to-analog convertor; and the comparator circuitry is adapted for comparing whether the delayed first sample deviates more than a predefined allowed deviation from the second sample.

In an embodiment, the sensor system further comprises a programmable processor adapted for receiving the main signal and the error signal; and further comprising a bus-transceiver connectable to a communication bus; and wherein the programmable processor is programmed for communicating an error message over the communication-bus when the error signal indicates a fault condition.

In an embodiment, the sensor unit comprises a Hall element, and a biasing circuit and a readout circuit, the readout unit being configured for providing the sensor signal.

In an embodiment, the sensor unit comprises a Hall element, and a biasing and readout circuit capable of applying the spinning-current technique, the biasing and readout circuit being configured for providing the sensor signal.

In an embodiment, the sensor unit comprises a Wheatstone bridge and a biasing circuit and a readout circuit, the readout circuit being configured for providing the sensor signal.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

DETAILED DESCRIPTION OF ILLUSTRATIVE EMBODIMENTS

Figure 1:
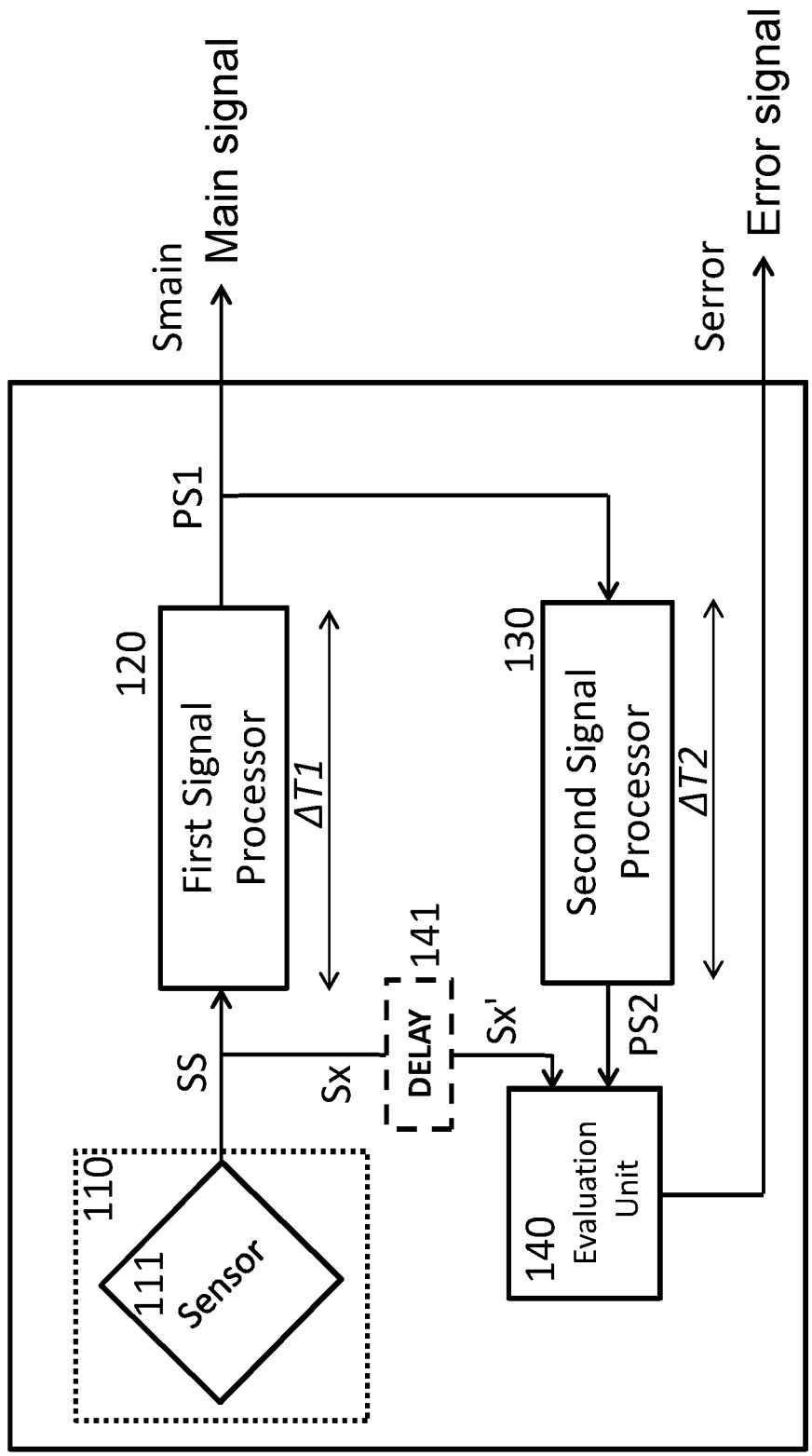
FIG. 1 shows a high level block diagram of a sensor system according to embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document the term "sensor" can refer to "sensor system" or "sensor device" or "sensor unit", depending on the context.

In this document the term "sensor unit" refers to a sub circuit containing a "sensor element" (e.g. a Hall element) or a "sensor structure" (e.g. a Wheatstone bridge) and optionally including "biasing means" and optionally including "readout means" or a portion of the readout means (for example including a switch for performing the well-known "spinning current technique", but not necessarily an amplifier). The sensor unit may comprise an amplifier (as would typically be the case when an output of the sensor unit is directly connected to an input of an ADC. Alternatively, the sensor unit does not contain an amplifier.

In this document the term "sensor system" refers to one or more integrated semiconductor devices having the functionality described further and illustrated in the drawings. In some embodiments the "sensor system" is a single monolithic semiconductor device comprising the functionality as shown or described, implemented on a single substrate, including the sensor unit, and optionally comprising further functional blocks such as a transceiver (not shown).

In this document the term "analog signal processor" means "an electrical circuit for receiving and/or for processing and/or for providing an analog signal", for example, a circuit comprising one or more of the following components or functional blocks: an adder, a subtractor, an analog amplifier, and ADC, a DAC, an analog multiplexer, an analog filter, a delay, a sample-and-hold circuit, a chopper, etc. It may comprise digital components such as for example a state machine and/or a timer or a counter to implement some of these functions.

In the present invention, the terms "signal processing unit" or "signal processor" are used as synonyms.

The present invention relates to semiconductor sensors suitable for automotive applications having self-diagnostics or self-test capabilities operable during normal operation of the sensor, in particular magnetic sensor, for example angular position sensors, but the present invention is not limited thereto and other sensors are also envisioned, such as pressure sensors. For ease of the description, the present invention will be explained mainly by referring to sensors having at least one Hall element.

Magnetic sensors using one or more Hall elements for measuring one or more magnetic field components (e.g. so-called "horizontal Hall elements" for measuring magnetic field components Bz oriented in a direction perpendicular to the substrate, or so-called "vertical Hall elements" for measuring magnetic field components parallel to the substrate) are known in the art, as are manners for biasing them (e.g. by applying a constant current or a constant voltage to excitation nodes) and for reading them out (e.g. by amplifying a differential signal over two output nodes), but biasing or readout circuits is not the main focus of the present invention, and will therefore not be explained in more detail here, in order not to obscure the inventive concepts proposed herein.

As explained in the background section, there is a need for sensors having self-diagnostics or self-test capabilities, without significantly increasing the cost.

A straightforward solution of a sensor system or sensor device having two identical signal paths, each including a sensor and processing circuitry, is known in the art, but this solution is not economical.

Also described in the background section is a solution using two physically distinct signal paths, the first signal path being a forward path (i.e. from the sensor element to the output) having a "main sensor" and "first circuitry", the second signal path also being a forward path, and having a "second sensor" and "second circuitry". While not exactly duplicating the first signal path, providing a functional second signal path including a sensor element and biasing means and readout means requires the addition of a relatively large amount of hardware. Moreover by adding additional switching means or multiplexers in between, the probability of detecting a fault may indeed increase, but also the probability of an additional fault arising in the second path or in the switching means or multiplexer increases, which is undesired.

The present invention proposes a radically different approach, and is based on the following principles:

(i) instead of providing two forward signal paths, the present invention provides a first, forward signal path and a second, backwards datapath, the second datapath being directed in the opposite direction of the first datapath;

(ii) instead of comparing signals at a downstream position of the first signal path and at a downstream position of the second signal path, the present invention proposes to compare a signal at an upstream position in the first signal path (optionally purely delayed) and a signal at a downstream position in the second signal path;

(iii) instead of providing same or similar functionality in the first signal path and the second signal path, albeit at a lower quality level (e.g. lower resolution or lower speed or higher noise), the present invention provides a first functionality in the first (forward) signal path and a second functionality in the second (backward) signal path, the second functionality being an inverse of the first functionality;

(iv) the proposed solution is capable of detecting a fault in a portion of the forward signal path, but without duplicating the sensor unit (e.g. sensor element and biasing circuit and readout circuit), and without adding an additional multiplexer or the like in the main signal path. In this way an error in the multiplexer or in the second signal path or in the control of the and/or multiplexer will not negatively influence normal behaviour of the forward signal path, and thus of the sensor system.

Referring now to the figures,

FIG. 1 shows a high level block diagram of a sensor system 100 according to embodiments of the present invention.

FIG. 1 shows a sensor system 100 for providing a main signal Smain indicative of (e.g. proportional to) a physical value to be measured (e.g. a magnetic field strength or a pressure, the present invention not being limited hereto) and an error signal Serror indicative of a malfunction of a portion of the sensor system 100. The sensor system 100 comprises a sensor unit 110 configured for providing a sensor signal SS to a first signal processing unit 120 (also referred to herein as "first signal processor"). The first signal processing unit 120 is arranged downstream of the sensor unit 110, and is configured for receiving a second signal Sx equal to or derived from the sensor signal SS, and is configured for performing a predefined first operation or a predefined first series of operations on said signal second Sx, to thereby provide a first processed signal PS1. In the embodiment shown in FIG. 1, the second signal Sx is equal to the sensor signal SS, but that is not the case for all embodiments of the present invention (see for example FIG. 4 and FIG. 5).

The sensor system 100 further comprises a second signal processing unit 130 (also referred to herein as "second signal processor") configured for receiving the first processed signal PS1, and for performing a predefined second operation or a predefined second series of operations on the first processed sensor signal PS1, to thereby provide a second processed signal PS2. Importantly, the second signal processing unit 130 is configured for performing an inverse operation compared to the first signal processing unit 120.

The sensor system 100 further comprises an evaluation unit 140 configured for receiving the second signal Sx or a delayed version thereof Sx', and for receiving the second processed signal PS2, and is configured for evaluating whether the second signal Sx or its delayed version Sx' corresponds to or matches the second processed signal PS2 within a predefined tolerance margin, and is configured for providing an output signal, referred to herein as error signal "Serror" for indicating whether the signals are within the predefined tolerance margin, or not. The delay circuit 141 (if present) may be part of the Evaluation unit 140, or may be a separate block.

Examples of functions and inverse functions are:

| operation or function f(x) | Inverse operation or function g(x) |
|---|---|
| ADC (16 bit) | DAC (16 bit), DAC (12 bit), DAC (8 bit) |
| time integrator, $f(x) = \int x \cdot dt$ | Time derivator, $g(x) = dx/dt$ |
| Multiplier, $f(x) = A * x$ | Divider, $g(x) = x/A$ |
| Square, $f(x) = x^2$ | Square root, $f = \sqrt{x}$ |
| sine, $f(x) = \sin(x)$ | arc sine, $g(x) = \arcsin(x)$ |

-continued

| operation or function f(x) | Inverse operation or function g(x) |
|---|---|
| cosine, f(x) = cos(x) | arc cosine, g(x) = arccos(x) |
| tangens, f(x) = tan(x) | arc tangens, g(x) = arctan(x) |
| adder, f(x) = x + A | Subtractor, g(x) = x − A |
| Modulation | demodulation |
| attenuation filter | gain filter |
| exponential function, f(x) = $e^x$ | logarithmic function, g(x) = ln(x) |

But the present invention is not limited to these examples, and other functions f(x) and g(x) can also be used. That said, it is noted that not all functions f(x) have an inverse function g(x), but for many or all of the envisioned sensor applications, the function f(x) to be performed by the first processor unit 120 is typically relatively simple processing in the time domain, such as amplification and/or offset correction and/or ADC, optionally followed by temperature compensation and/or stress compensation which typically means multiplication with a value close to 1.0 (e.g. in the range from 0.800 to 1.200). The inventors surprisingly realised that these functions can be approximated relatively accurately by a monotonically increasing function f(x), (apart from quantisation noise), which do have an inverse function g(x), which can be approximated for example by a piecewise linear approximation or by a polynomial function of relatively low order (e.g. first order or second order or third order).

The inventors also realised that the accuracy of the second data path does not need to be very high when used for the purpose of detecting a fault condition in a portion of the first signal path, for example in the first signal processor 120. Therefore, in order to save costs, preferably the second signal processing unit 130 has at least one characteristic selected from the group consisting of: being slower, being less precise, having or generating more noise, occupying less space, and dissipating less power than the first signal processing unit 120. More specifically, the second signal processing unit may be designed to have a signal-to-noise ratio of at least 10 dB higher or at least 20 dB higher than the first signal processing unit, and/or the second signal processing unit may be designed to occupy less than 50% or less than 25% of the space occupied by the corresponding first signal processing unit, and/or the second signal processing unit may be designed to consume less than 50% or less than 25% energy than the first signal processing unit, and/or the second signal processing unit may be designed to be at least 2.0 or at least 4.0 times slower than the first signal processing unit.

These are the main concepts underlying the present invention. Other aspects of the present invention will be described in more detail when discussing the embodiments shown in FIG. 2 to FIG. 9.

Figure 2:
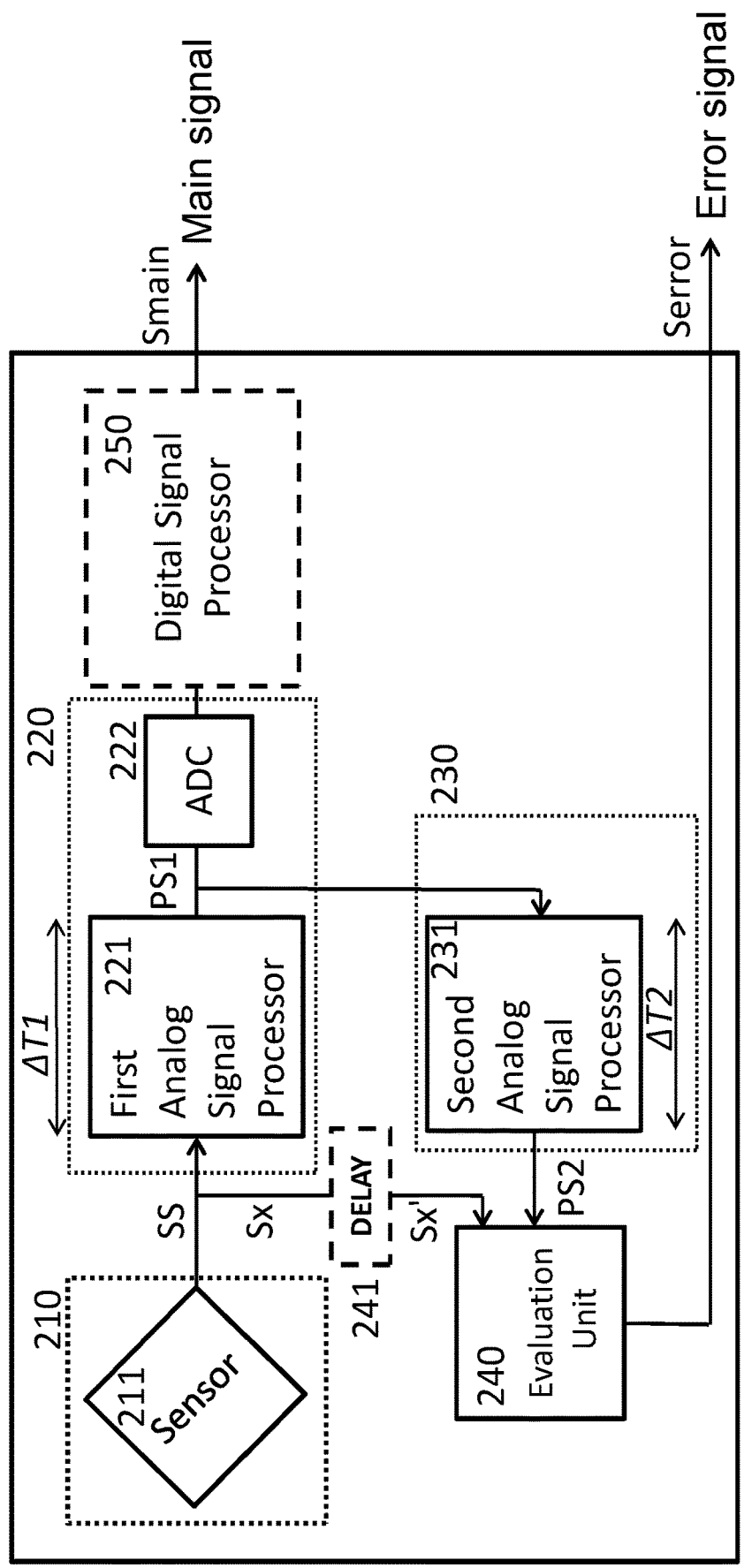
FIG. 2 to FIG. 6 show embodiments according the present invention, having an Analogue Signal Processor in the forward data path.

FIG. 2 shows a sensor system 200 according to an embodiment of the present invention.

The functionality shown may be implemented in one or more chips, but preferably is implemented in a single CMOS device. As can be seen, the first signal processor 220 comprises an analogue signal processor 221 followed by an analogue-to-digital converter (ADC) 222. The second signal path also comprises an analogue signal processor 231 but performing the inverse function of the analogue signal processor 221 in the main signal path.

The sensor system 200 shown in FIG. 2 may further comprise additional circuitry, such as for example a digital signal processor 250 (DSP), for example a programmable DSP, connected to non-volatile memory (e.g. Flash) and volatile memory (RAM) (not shown), for further processing of the sensor signal, and/or for transmitting the sensor signal, etc.

The sensor system or the sensor device 200 shown in FIG. 2 may be part of a so-called "Electronic Control Unit", abbreviated as ECU, in which case the sensor system would further comprise a central controller and a bus-transceiver (not shown), in particular a LAN-bus transceiver. The error signal "Serror" may then be provided to the central controller, and the central controller would be provided for sending an error message over the communication bus, e.g. LAN-bus. However the present invention is not limited thereto.

By comparing the signal Sx or the delayed signal Sx' on the one hand, with the second processed signal PS2 on the other hand, for example by testing whether a difference between these values is smaller than a predefined threshold, the evaluation unit 240 is capable of detecting a fault condition in the first analog signal processor 221.

It is noted that the evaluation unit may compare the values continuously, or may take samples periodically, and compare these samples, for example every 1 ms.

Preferably the delay unit 241, if present, is adapted for delaying the signal Sx by a predefined time period, preferably equal to about ΔT1+ΔT2, where ΔT1 is the processing time of the first analog signal processor or the time after which a pulse at its input SS is visible at its output PS1, and ΔT2 is the processing time of the second analog signal processor or the time after which a pulse at its input PS1 is visible at its output PS2.

The delay unit may comprise for example a charge-coupled device (where charge is passed from one storage unit to the next in a cascaded manner), or may comprise for example a plurality of sample-and-hold units operated asynchronously, and their outputs being connected to an input of a multiplexer adapted for passing the "oldest" sample, or can be implemented in any other suitable manner.

Figure 3:
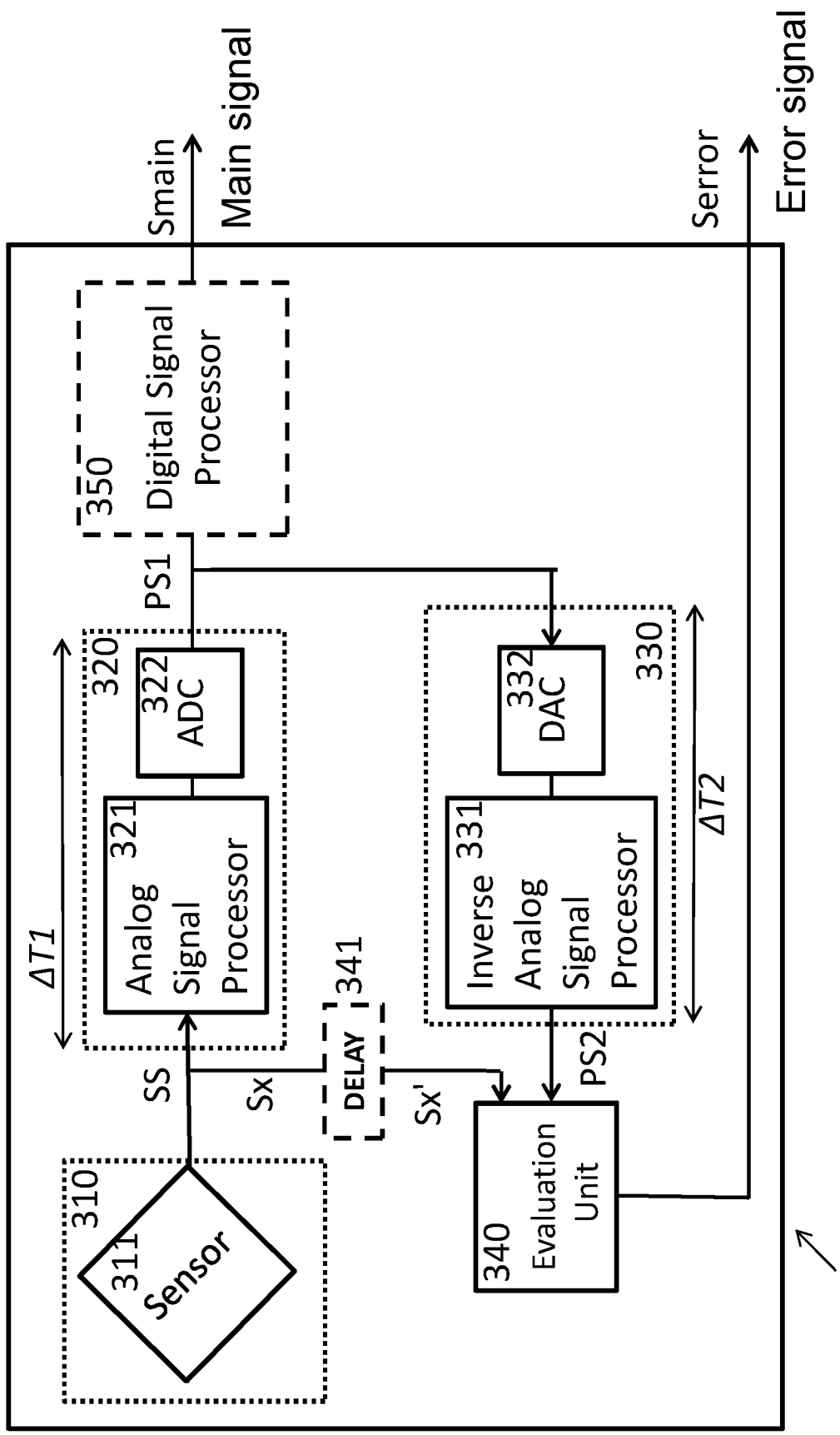

FIG. 3 shows a sensor system 300 according to embodiments of the present invention, as a variant of the sensor system 200 shown in FIG. 2. In addition to what was shown in FIG. 2 and described in relation to FIG. 2, in the embodiment of FIG. 3 the second signal processor 330 comprises a digital to analog converter (DAC) 332, followed by an analogue signal processor 331 adapted for performing an inverse function of the analogue signal processor 321 in the forward signal path.

This embodiment allows to detect a fault condition in the analog signal processor 321 and a fault condition in the ADC 322.

Figure 4:
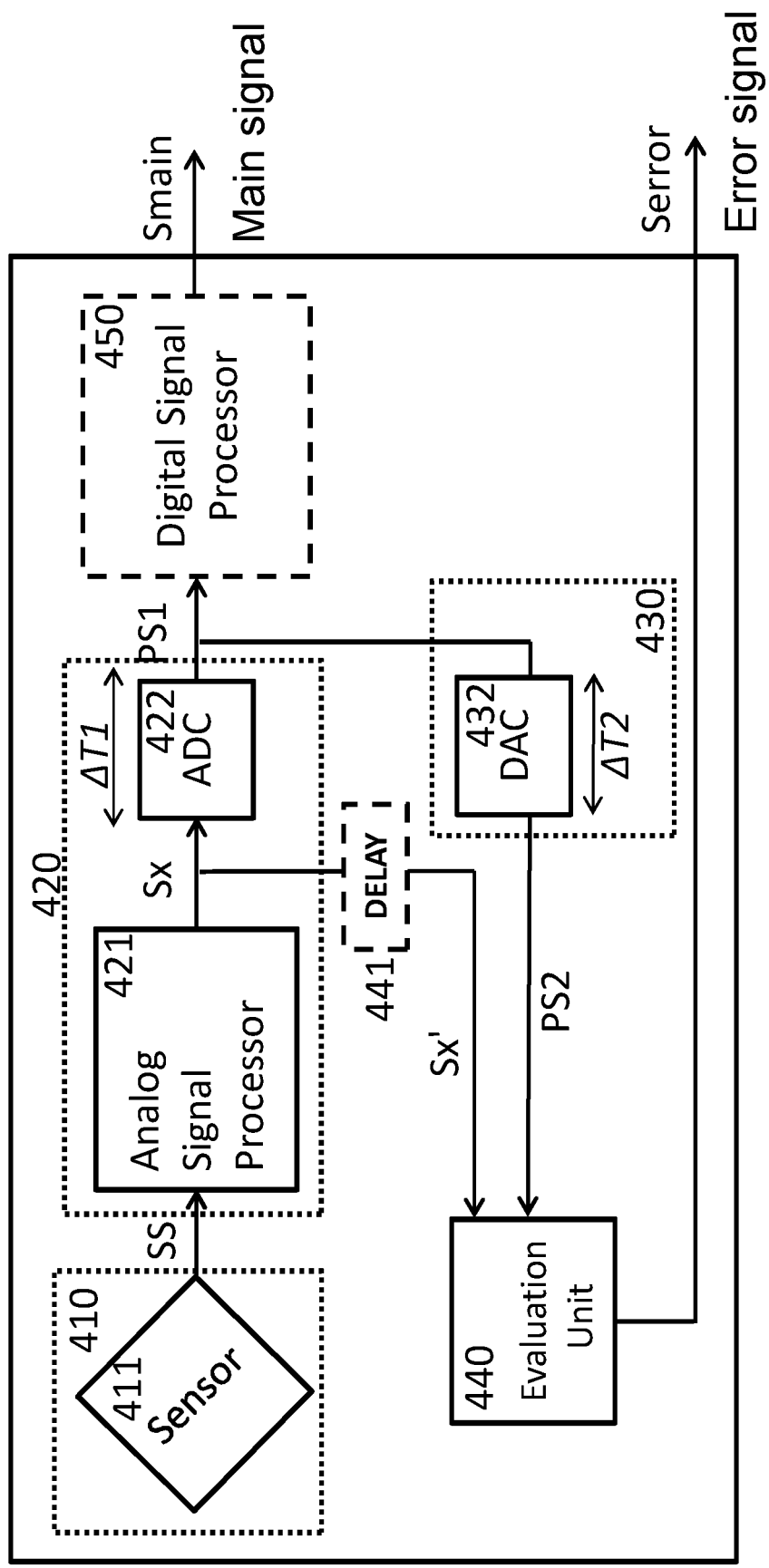

FIG. 4 shows a sensor system 400 according to an embodiment of the present invention, as a variant of the sensor system 300 shown in FIG. 3. The main differences between FIG. 4 and FIG. 3 is that the second signal Sx is not equal to the sensor signal SS, but is provided by the first analogue signal processor block 421, and that the second signal path does not contain an analogue signal processor, but only a DAC 432.

The delay of the delay unit 441 (if present) could be chosen equal to the sum of the processing time ΔT1 of the ADC 422 and the processing time ΔT2 of the DAC 432

This embodiment allows to detect a fault condition in the ADC 422 of the forward signal path.

Figure 5:
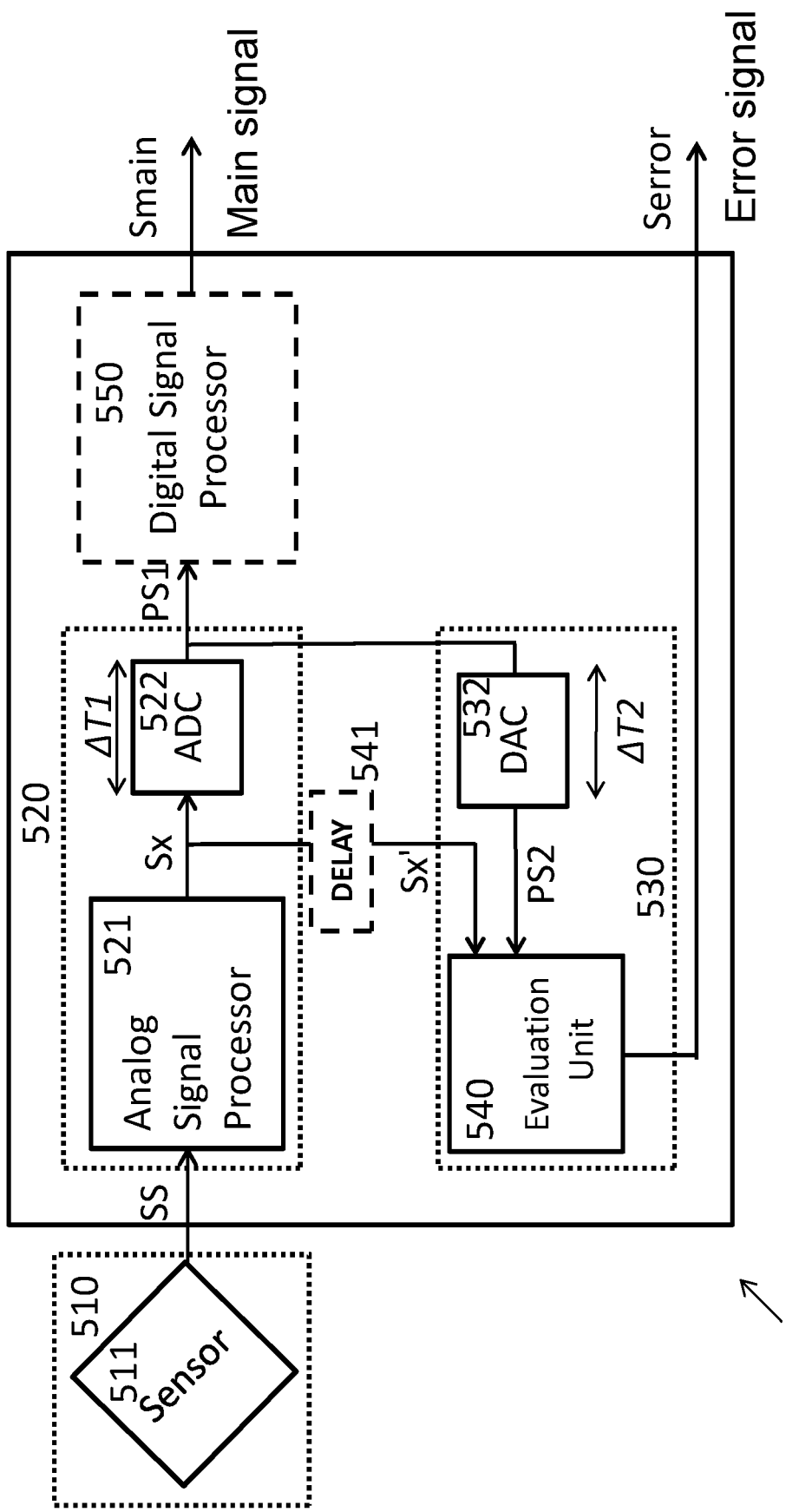

FIG. 5 shows a sensor system 500 according to an embodiment of the present invention, as a variant of the sensor system 400 shown in FIG. 4. The main difference being that the sensor unit 510 is not implemented on the same substrate as the other components shown in FIG. 5. The sensor unit 510 may be implemented on a second substrate, physically distinct from the first substrate, which second substrate may be a CMOS substrate or a non-CMOS substrate, for example a Ge-substrate or a GaAs-substrate or any other suitable semiconductor substrate. The second substrate is preferably embedded in the same chip as the first substrate.

This embodiment allows to detect a fault condition in the ADC 522 of the forward signal path.

Figure 6:
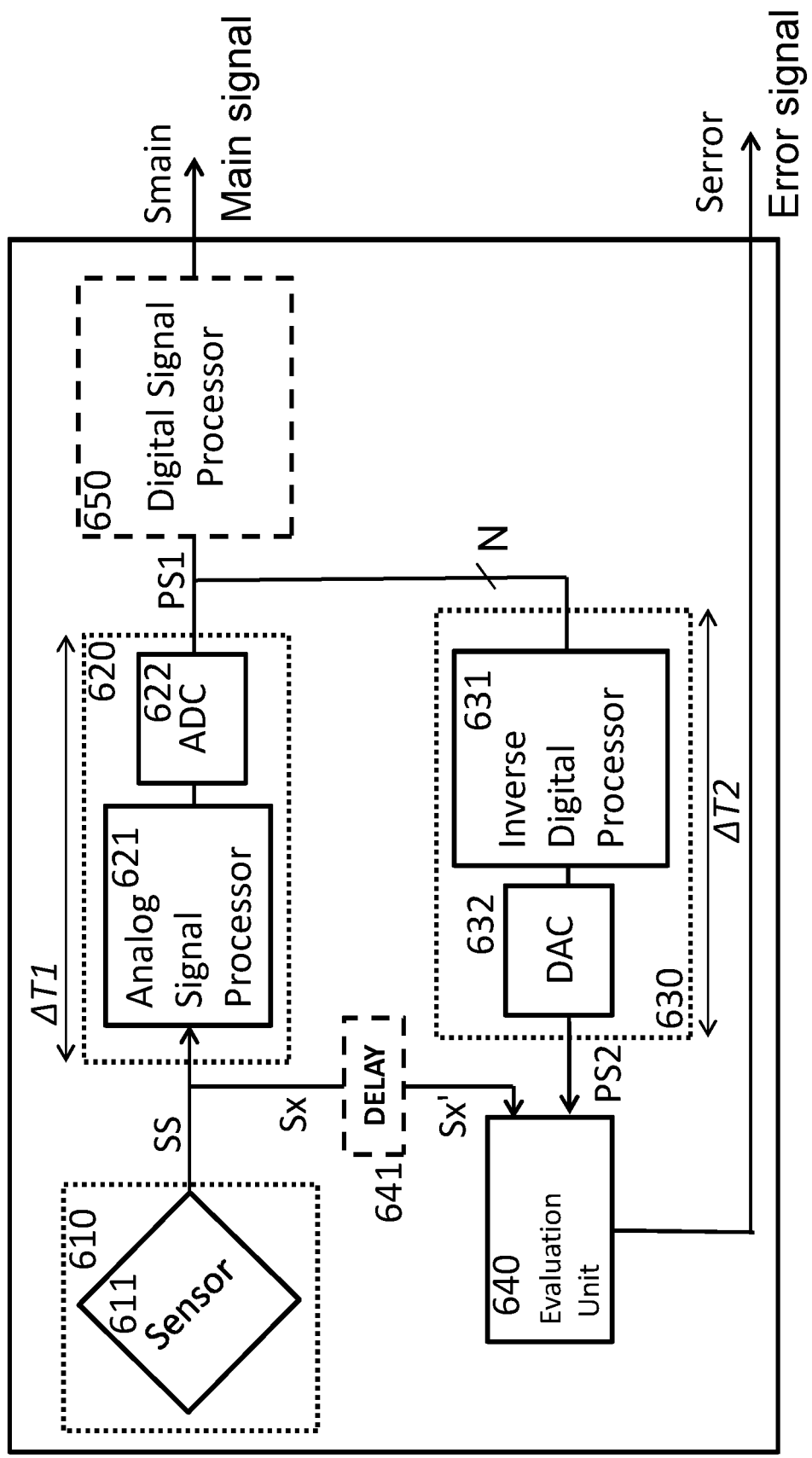

FIG. 6 shows a sensor system 600 according to an embodiment of the present invention, as a variant of the sensor system 300 shown in FIG. 3. Similar to the sensor system 300 shown in FIG. 3, the sensor system 600 allows to detect a fault condition in any of the Analog Signal Processor 621 and the ADC 622 of the forward signal path, but uses other hardware blocks in the second signal path than the ones of FIG. 3. Whereas the sensor signal 300 of FIG. 3 uses a DAC 332 followed by an analogue processor block 331 in the second data path, the sensor system 600 of FIG. 6 uses a digital processing circuit 631 followed by a DAC 632. The digital processing circuit 631 may comprise a microcontroller, and/or a state machine with a lookup table, but the present invention is not limited thereto, and other digital processing circuits are also possible.

In a simple implementation, a subset of the number of bits of the signal PS1 can be directly used as an index in the lookup table, and the value to be provided to the DAC 632 may be directly obtained from the lookup table. In an alternative embodiment, the inverse digital processor 631 may comprise a simple microcontroller. The microcontroller may be adapted for calculating a piecewise linear approximation of the inverse function g(x), or may be adapted for calculating a polynomial expression with predefined coefficients, or for calculating any other function.

Figure 7:
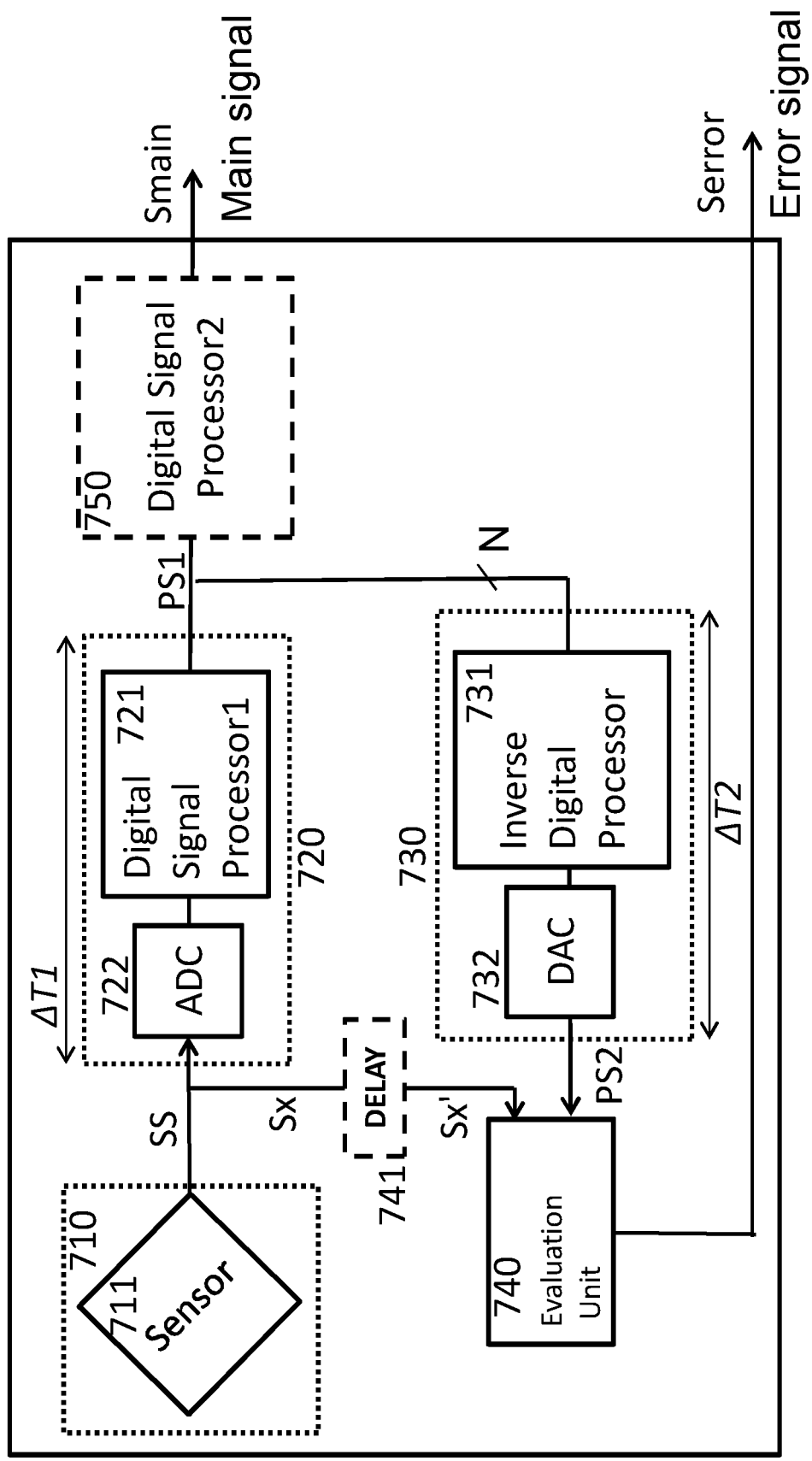
FIG. 7 and FIG. 8 show embodiments according to the present invention, having a Digital Signal Processor in the forward data path.

FIG. 7 shows a sensor system 700 according to an embodiment of the present invention, as a variant of the sensor system 600 shown in FIG. 6. The main difference being that the forward path of the sensor system 700 of FIG. 7 comprises an ADC 722 followed by a digital signal processor 721, whereas the forward path of the sensor system 600 of FIG. 6 comprises an analog signal processor 621 followed by an ADC 622.

As shown in FIG. 7, the forward path of the sensor system 700 may comprise a first digital processor 721 and a second digital processor 750, which may be implemented as two physically distinct circuits.

Alternatively, the first and second digital processor 721, 750 may be implemented as on a single digital processor, for example as a first and second software component executed on a single programmable device, and wherein an intermediate result is provided as the first processed signal PS1, which is provided to the second, backward datapath.

Figure 8:
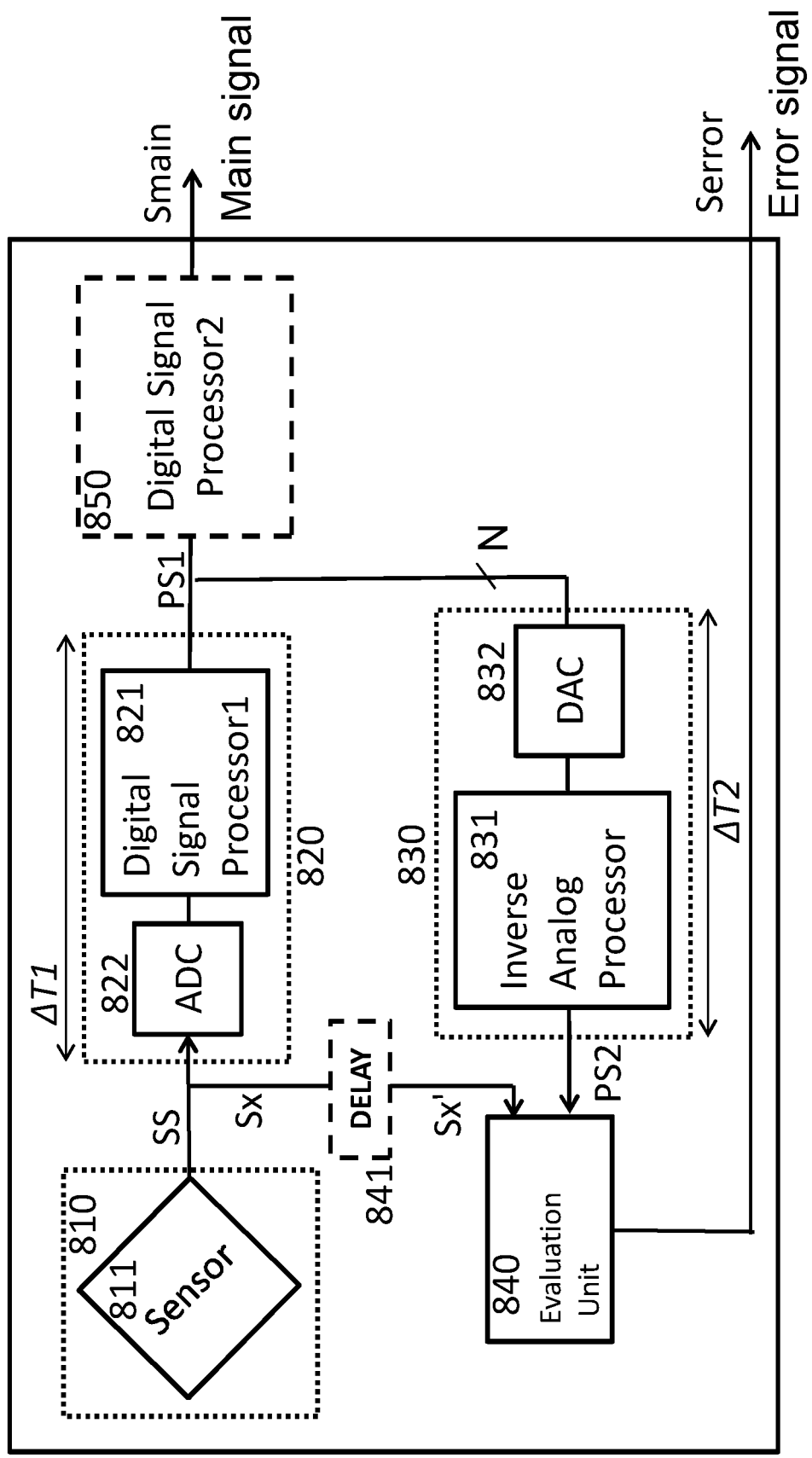

FIG. 8 shows a sensor system 800 according to an embodiment of the present invention, as a variant of the sensor system 700 shown in FIG. 7. The main difference being that the backward path of the sensor system 800 of FIG. 8 comprises a DAC 832 followed by an analogue signal processor 831, whereas the backward path of the sensor system 700 of FIG. 7 comprises a digital processing circuit 731 followed by a DAC 732.

FIG. 9 shows several examples of sensor units 910 which can be used in embodiments of the present invention.

Figure 9A:
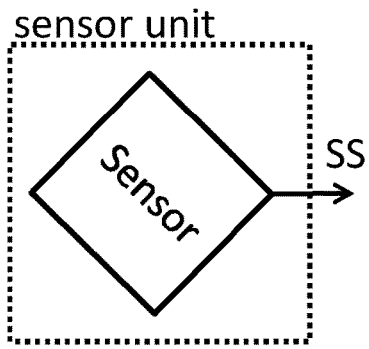
FIG. 9(a) shows a schematic representation of a sensor unit comprising at least one sensor element or comprising a sensor structure as can be used in the sensor systems of FIG. 1 to FIG. 8.

FIG. 9(a) shows a schematic representation of a sensor unit as can be used in any of the sensor systems of FIG. 1 to FIG. 8.

Figure 9B:
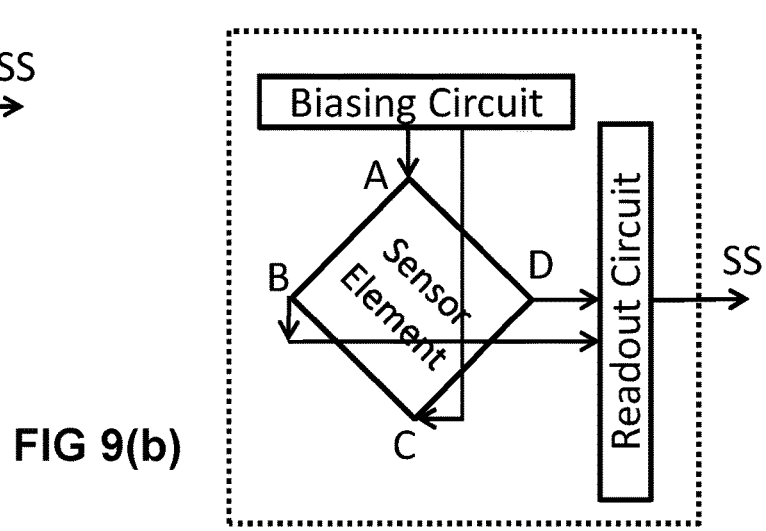
FIG. 9(b) shows an example of a sensor unit comprising a sensor element and a biasing circuit for biasing said sensor element, and a readout circuit for obtaining a sensor signal from said sensor element.

FIG. 9(b) shows an example of a sensor unit comprising a sensor element (e.g. a Hall element), and comprising a biasing circuit for applying an excitation current or excitation voltage to some of the nodes of the sensor element (e.g. to node A, C), and comprising a readout circuit for obtaining a differential signal from the sensor element (for example from node B, D), in manners known per se in the art.

Figure 9C:
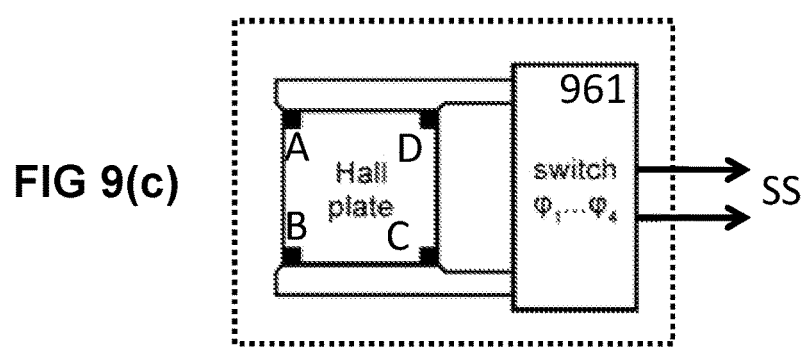
FIG. 9(c) shows an example of a sensor unit comprising a Hall plate, and a biasing-and-readout circuit with switches for biasing and reading out the Hall plate using a so called "spinning current" technique.

FIG. 9(c) shows an example of a sensor unit comprising a Hall element (also known as "Hall plate") having four nodes A,B,C,D connected to a switching unit 961, for performing the so-called spinning current technique, known per se in the art. In the example shown the output of the switching unit is a differential signal which is typically connected to an input of the differential amplifier. This differential amplifier may be considered to be part of the sensor unit, or may be considered to be part of the Signal processor 120, 221, 321, 421, 521, 621.

Figure 9D:
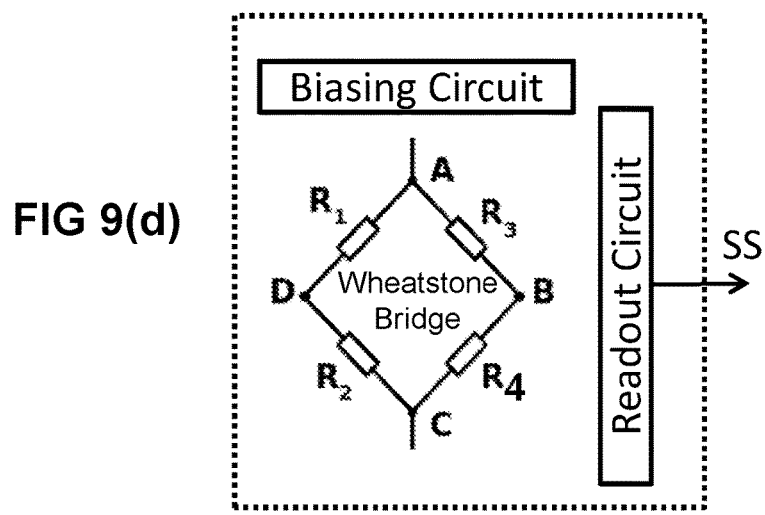
FIG. 9(d) shows a sensor unit comprising a resistive sensor structure in the form of a Wheatstone bridge, and a biasing circuit for applying a biasing voltage or a biasing current to the bridge, and a readout circuit for obtaining a sensor signal from the sensor structure.

FIG. 9(d) shows an example of a sensor unit comprising a sensor structure (e.g. a Wheatstone bridge), and comprising a biasing circuit for applying an excitation current or excitation voltage to some of the nodes of the sensor structure (e.g. to node A, C), and comprising a readout circuit for obtaining a differential signal from the sensor structure (for example from node B, D), in manners known per se in the art.

Evaluation Circuit:

Coming back to the "evaluation unit", it is noted that the evaluation unit 240 as described in relation to FIG. 2 can be used in any of the embodiments described in FIG. 1 to FIG. 8, but the present invention is not limited thereto, and the skilled person may use any other suitable evaluation circuit capable of evaluating whether the signal Sx (or a delayed version Sx' thereof) and the signal PS2 sufficiently match according to a predefined criterion. A few exemplary circuits are described next.

The evaluation unit may comprise a first sample-and-hold circuit configured for sampling and holding the second signal Sx (or a delayed version Sx' thereof) as a first analog sample, and may comprise a second sample-and-hold circuit configured for sampling and holding the second processed signal PS2 as a second analog sample. The evaluation unit may further comprise comparator circuitry adapted for comparing whether the first sample deviates more than a predefined allowed deviation from the second sample, and for providing the error signal Serror for indicating that a fault condition has occurred if the first sample is found to deviate more than the predefined allowed deviation from the second sample.

In some embodiments of the present invention, there is no separate delay unit 141, 241, 341, 441, 541, 641, 741, 841 and the evaluation unit 140, 240, 340, 440, 540, 640, 740, 840 does is adapted for sampling the signals at the two inputs of the evaluation unit at the same moment. If the sensor signal does not change very fast, this simple approach may be sufficient.

In other embodiments of the present invention, the evaluation unit also samples the signals Sx' and PS2 arriving at its inputs at the same time, but the sensor system comprises a separate delay unit 141, 241, 341, 441, 541, 641, 741, 841 external from the evaluation unit.

In yet other embodiments of the present invention, the evaluation unit does not sample the signals Sx' and PS2 at all, but compares the signals Sx' and PS2 continuously. The delay unit (outside the evaluation unit) may be present, or may not be present.

In a particular embodiment, the sensor system does not contain a delay unit 241, but further comprises a timer or counter, and the evaluation unit is further adapted for sampling the signal Sx at a first moment T1 in time, and for sampling the signal PS2 at a second moment T2 in time, the second moment T2 being a predefined delay ΔT later than T1, and the comparator circuitry is adapted for comparing whether the S&H first sample deviates more than a predefined allowed deviation c from the second sample. This implementation allows a more accurate detection at almost no additional cost. The value of c is preferably a predefined constant value.

The error signal may be a signal having a first level (e.g. "0") for indicating that no fault was detected, and having a second level (e.g. "1") for indicating that a fault was detected, or vice versa. This signal may be provided to a control unit embedded in the same sensor device (e.g. a programmable processor), or to a control unit outside of the sensor device.

The present invention also relates to a sensor system or sensor device as described above, further comprising a programmable processor adapted for receiving the main signal "Smain" and the error signal "Serror", and further comprising a bus-transceiver connectable to a communication bus, for example a CAN-bus in an automobile. The programmable processor is preferably programmed for communicating an error message over the communication-bus when the error signal indicates a fault condition, or setting an appropriate flag or the like, depending on the protocol being used on the communication-bus.

While individual features are explained in different drawings and in different embodiments of the present invention, it is contemplated that features of different embodiments can be combined, as would be obvious to the skilled person, when reading this document.

The invention claimed is:

1. A sensor system for providing a main signal indicative of a physical signal to be sensed, and an error signal indicative of a malfunction of a portion of the sensor system, the sensor system comprising:
    a sensor unit configured for providing a sensor signal;
    a first signal processor arranged downstream of the sensor unit, and adapted for receiving a second signal equal to or derived from a sensor signal, and being adapted for performing a first operation or a first set of operations on said second signal so as to provide a first processed signal;
    a second signal processor adapted for receiving the first processed signal and for performing a second operation or a second set of operations on the first processed sensor signal so as to provide a second processed signal, wherein the second operation or second set of operations are an inverse of the first operation or of the first set of operations; and
    an evaluation unit adapted for receiving the second signal or a delayed version of the second signal, and for receiving the second processed signal, and adapted for evaluating whether the second signal or its delayed version matches the second processed signal within a predefined tolerance margin, and adapted for providing an error signal corresponding to the result of the evaluation,
    wherein the second signal processor has at least one characteristic selected from the group consisting of: being slower, being less precise, having or generating more noise, occupying less space, dissipating less power than the first signal processing unit,
    wherein the evaluation unit comprises sample-and-hold circuitry configured for sampling and holding the second signal as a first sample, and configured for sampling and holding the second processed signal as a second sample, and
    wherein the evaluation unit further comprises comparator circuitry adapted for comparing whether the first sample deviates more than a predefined allowed deviation from the second sample; and
    wherein the evaluation unit is configured for providing the error signal for indicating a fault condition if the first sample is found to deviate more than the predefined allowed deviation from the second sample.

2. The sensor system of claim 1, wherein the first signal processor comprises or consists of an analog-to-digital convertor, and the second signal processor comprises or consists of a digital-to-analog convertor; and/or
    wherein the first signal processor comprises or consists of a time integrator, and the second signal processor comprises or consists of a time derivator, or vice versa, and/or
    wherein the first signal processor comprises or consists of a multiplier, and the second signal processor comprises or consists of a divider, or vice versa, and/or
    wherein the first signal processor comprises or consists of a modulator, and the second signal processor comprises or consists of a demodulator, or vice versa, and/or
    wherein the first signal processor comprises or consists of an amplifier, and the second signal processor comprises or consists of a attenuator, or vice versa; and/or
    wherein the first signal processor comprises or consists of a first frequency filter, and the second signal processor comprises or consists of a second frequency filter, being the inverse of the first frequency filter; and/or
    wherein the first signal processor is adapted for performing a first mathematical function selected from the group consisting of: a square function, a goniometric function, an exponential function, and the second signal processor is adapted for performing a second mathematical function selected from the group consisting of: a square-root function, a goniometric function, a logarithmic function respectively, or vice versa.

3. The sensor system of claim 1, wherein the sensor unit and the first signal processor and the second signal processor and the evaluation unit are implemented on a single substrate.

4. The sensor system of claim 3, wherein the substrate is a CMOS substrate.

5. The sensor system of claim 1, wherein an input of the first signal processor is directly connected to an output of the sensor unit, and the second signal is equal to the sensor signal.

6. The sensor system of claim 1, wherein the first signal processor mainly comprises an analog signal processor, and the second signal processor mainly comprises an analog signal processor.

7. The sensor system of claim 1, wherein
    the first signal processor includes a first analog circuit,
    the second signal processor includes a second analog circuit, and
    each of the first analog circuit and the second analog circuit includes an adder, a subtractor, an analog amplifier, an analog-to-digital converter (ADC), a digital-to-analog converter (DAC), an analog filter, a delay, or a sample-and-hold circuit.

8. The sensor system of claim 1, wherein the first signal processor comprises an analog-to-digital convertor, and
    wherein the second signal processor comprises a digital-to-analog convertor.

9. The sensor system of claim 1, wherein the first signal processor includes an analog circuit followed by an analog-to-digital convertor, and the second signal processor includes a digital circuit followed by a digital-to-analog converter.

10. The sensor system according to claim 9, wherein the digital-to-analog-convertor has a lower resolution and/or a lower speed than the analog-to-digital convertor.

11. The sensor system of claim 1, wherein the evaluation unit comprises a first sample-and-hold circuit configured for sampling and holding the second signal as the first sample, and a second sample-and-hold circuit configured for sampling and holding the second processed signal as the second sample.

12. The sensor system according to claim 1, further comprising a timer or counter; and
wherein the evaluation unit is further adapted for delaying the first sample by a predefined delay to obtain a delayed first sample, the predefined delay corresponding to a sum of a first processing time of the first signal processor and a second processing time of the second signal processor and optionally a third processing time of the analog-to-digital convertor and optionally a fourth processing time of the digital-to-analog convertor; and
wherein the comparator circuitry is adapted for comparing whether the delayed first sample deviates more than a predefined allowed deviation from the second sample.

13. The sensor system according to claim 1,
further comprising a programmable processor adapted for receiving the main signal and the error signal; and
further comprising a bus-transceiver connectable to a communication bus; and
wherein the programmable processor is programmed for communicating an error message over the communication-bus when the error signal indicates a fault condition.

14. The sensor system according to claim 1, wherein the sensor unit comprises a Hall element, and a biasing circuit and a readout circuit, the readout circuit being configured for providing the sensor signal.

15. The sensor system of claim 1, wherein the first signal processor mainly comprises an analog signal processor, and the second signal processor mainly comprises a digital signal processor.

16. The sensor system of claim 1, wherein the first signal processor mainly comprises a digital signal processor, and the second signal processor mainly comprises an analog signal processor.

17. The sensor system of claim 1, wherein the first signal processor mainly comprises a digital signal processor, and the second signal processor mainly comprises a digital signal processor.

18. The sensor system according to claim 1, wherein the sensor unit comprises a Hall element, and a biasing and readout circuit capable of applying the spinning-current technique, the biasing and readout circuit being configured to provide the sensor signal.

19. The sensor system according to claim 1, wherein the sensor unit comprises a Wheatstone bridge and a biasing circuit and a readout circuit, the readout circuit being configured to provide the sensor signal.

20. A sensor system for providing a main signal indicative of a physical signal to be sensed, and an error signal indicative of a malfunction of a portion of the sensor system, the sensor system comprising:
a sensor unit configured to provide a sensor signal;
a first signal processor arranged downstream of the sensor unit, the first signal processor being adapted to receive a second signal equal to or derived from the sensor signal, and the first signal processor being adapted to perform a first operation or a first set of operations on said second signal so as to provide a first processed signal;
a second signal processor adapted to receive the first processed signal and perform a second operation or a second set of operations on the first processed sensor signal so as to provide a second processed signal, wherein the second operation or second set of operations are an inverse of the first operation or of the first set of operations, respectively; and
an evaluation unit adapted to
receive the second signal or a delayed version of the second signal,
receive the second processed signal,
evaluate whether the second signal or the delayed version of the second signal matches the second processed signal within a predefined tolerance margin, and
provide an error signal corresponding to the result of the evaluation,
wherein the second signal processor has one or more of the following characteristics
being slower than the first signal processing unit, being less precise than the first signal processing unit, having or generating more noise than the first signal processing unit, occupying less space than the first signal processing unit, or dissipating less power than the first signal processing unit,
wherein the evaluation unit comprises sample-and-hold circuitry configured for sampling and holding the second signal as a first sample, and configured for sampling and holding the second processed signal as a second sample, and
wherein the evaluation unit further comprises comparator circuitry adapted for comparing whether the first sample deviates more than a predefined allowed deviation from the second sample; and
wherein the evaluation unit is configured for providing the error signal for indicating a fault condition if the first sample is found to deviate more than the predefined allowed deviation from the second sample.

* * * * *